(12) United States Patent
Agatstein et al.

(10) Patent No.: US 6,594,556 B1
(45) Date of Patent: Jul. 15, 2003

(54) UPGRADEABLE VOLTAGE REGULATOR MODULES

(75) Inventors: Louis W. Agatstein, El Dorado Hills, CA (US); James R. Neal, Cameron Park, CA (US)

(73) Assignee: Intel Corporation, Santa Clara, CA (US)

( * ) Notice: Subject to any disclaimer, the term of this patent is extended or adjusted under 35 U.S.C. 154(b) by 1482 days.

(21) Appl. No.: 08/795,817

(22) Filed: Feb. 5, 1997

Related U.S. Application Data

(63) Continuation of application No. 08/382,129, filed on Feb. 1, 1995, now abandoned.

(51) Int. Cl.[7] .................................................. G05D 9/00
(52) U.S. Cl. ........................ 700/298; 361/785; 323/282
(58) Field of Search ................................ 323/267, 268, 323/317, 283; 322/215, 313; 307/86; 365/226; 361/18

(56) References Cited

U.S. PATENT DOCUMENTS

| | | | | |
|---|---|---|---|---|
| 4,233,644 A | * | 11/1980 | Hwang et al. ............... | 361/384 |
| 4,296,455 A | * | 10/1981 | Leaycraft et al. ............ | 361/383 |
| 5,083,043 A | * | 1/1992 | Yoshida ..................... | 307/296.8 |
| 5,336,986 A | * | 8/1994 | Allman ....................... | 323/268 |
| 5,479,319 A | * | 12/1995 | Werther ....................... | 361/784 |
| 5,481,436 A | * | 1/1996 | Werther ....................... | 361/784 |
| 5,493,203 A | * | 2/1996 | Dalton ........................ | 323/282 |
| 5,502,374 A | * | 3/1996 | Cota .......................... | 324/127 |

FOREIGN PATENT DOCUMENTS

| | | |
|---|---|---|
| EP | 0556605 | 8/1993 |
| EP | 0641046 | 3/1995 |

\* cited by examiner

*Primary Examiner*—Leo Picard
*Assistant Examiner*—Sheela Rao
(74) *Attorney, Agent, or Firm*—Blakely, Sokoloff, Taylor & Zafman LLP

(57) ABSTRACT

An apparatus for regulating voltage and power in a computer system is disclosed. The voltage and power regulation is performed by voltage regulation circuitry on a voltage regulator module. The voltage regulator module is a detachable unit which interfaces with the motherboard through a socket connector. The socket connector has a fixed pin definition which allows a variety of voltage regulator modules programmed to regulate voltages and power at different levels to be implemented on the motherboard.

23 Claims, 8 Drawing Sheets

|    | A | B |
|----|------|------|
| 1  | VSS | VSS |
| 2  | VSS | VSS |
| 3  | RES | VI/O |
| 4  | VI/O | VI/O |
| 5  | +3.3V | +3.3V |
| 6  | +3.3V | +3.3V |
| 7  | VCORE | VCORE |
| 8  | VCORE | VCORE |
| 9  | VSS | VCORE |
| 10 | VCORE | VCORE |
| 11 | PWRGOOD | UPVRM# |
| 12 | SENSE | DISABLE |
| 13 | VSS | VSS |
| 14 | +5.0V | +5.0V |
| 15 | +5.0V | +5.0V |

FIG. 4

UPGRADEABLE VOLTAGE REGULATOR MODULES

This is a continuation of application Ser. No. 08/382,129, filed Feb. 1, 1995, now abandoned.

FIELD OF THE INVENTION

The present invention relates to the field of voltage regulators. More specifically, this invention relates to voltage regulators in a computer system.

BACKGROUND OF THE INVENTION

Computer systems typically contain a number of integrated circuits (ICs). Many ICs, such as microprocessors, are defined with specific power and voltage requirements. At the time an IC is designed, the specifications for the circuit boards which implement these ICs are also defined to accommodate the power and voltage requirements of the ICs. Difficulty occurs when there is a change in IC design which requires redefining a specific voltage or power requirement. This is common either during the design, manufacturing, or testing phases of production, or when an upgrade is desired after production.

Typically in these situations, two approaches have been taken. A first approach is to completely redesign the circuit board to accommodate for the power and voltage requirements of the new IC. This approach is typically costly and undesirable, especially when a large number of circuit boards have already been designed and manufactured to meet an original specification. The second approach is to design a circuit board which has the flexibility of adapting to several ICs with various power and voltage requirements. This second approach is more desirable from an economical standpoint, but is also more difficult from a design standpoint.

There have been several attempts to design a circuit board which can provide different regulated power and voltage levels to specific ICs on the circuit board. One approach was the implementation of on-circuit board voltage regulators and flexible motherboards. Both the on-circuit board regulator and the flexible motherboard designs allowed the preset voltage level of the system to be reset to a new voltage level for specific ICs. This was accomplished through a dedicated set of circuitry on the motherboard. The circuitry was adjustable for varying the voltage required by the components in the system.

The voltage and power supplied by both the on-circuit board voltage regulator and flexible motherboard, however, were limited by the definitions of their design. In order to maximize the flexibility of a circuit board design, the regulator and the circuit board had to implement the maximal solution which was often the most expensive solution. Thus, if 10% of a manufacturer's product line is comprised of microprocessors which required a specialized voltage regulation, the manufacturer had to implement the solution for specialized voltage regulation for every one of its circuit boards. This was necessary if the manufacturer wished to use a standard circuit board for all its products. This implementation was wasteful when a system was not required to utilize a specialized solution which was more expensive. On the other hand, if a maximal solution was not implemented in a design and the dedicated circuitry on the board was unable to be adjusted to meet the specific voltage and power requirements of the system, then the on-circuit board voltage regulator or flexible motherboard had no utility and the circuit board had to be redesigned.

In addition to having to implement the maximal solution for the board, both the on-circuit board voltage regulator and flexible motherboard had the drawback of not being able to adjust the power or the tolerance level that was delivered to the application. For example, a board that was set with a 3.0±10% volt supply could be reset to 3.1±10% volts. The board, however, could not be reset with a 3.0±5% volts supply, or be adjusted to deliver 4 amps if it was originally designed to deliver 3 amps. In other words, in the past if the tolerance or power requirements of an IC was modified, the circuit board had to be redesigned.

Another approach to making the circuit board more flexible was through an on-chip regulator design. An on-chip regulator design integrated a voltage regulator and an IC in the same package to provide on-package regulation of voltage and power to the IC. Since the voltage and power regulation for the IC was done within the same package, no modifications were needed on the circuit board for implementing a new IC with different voltage or power requirements.

A major drawback of the on-chip regulator design was thermal isolation. Since the regulator component and the IC component were packaged closely to each other, the heat dissipated by the components affected the overall performance of the entire unit. Thermal isolation limited the total power that both components dissipated. In conjunction with the problem of thermal isolation, heat sinks used a large percentage of the available package space in the on-chip regulator. This reduced the available space for the regulation component and required the level of integration for the regulator to be high, which was expensive.

Thus, an economical and efficient power regulation device which enables the delivery of specified voltage and power level to specified components on a circuit board is desired. The present invention overcomes the drawbacks of the prior art by providing a detachable power regulating device which may be removed from the motherboard and replaced with a second detachable power regulating device when components on the circuit board require a different power or voltage delivery. The present invention utilizes a design which allows it to be positioned at a location on the circuit board that maximizes the advantages of locality while minimizing the effects of heat dissipation.

SUMMARY OF THE INVENTION

The present invention relates to an apparatus for providing regulated power and voltage to components on a circuit board.

In one embodiment, the invention comprises a detachable power regulating device which regulates power and voltages to predetermined levels. The power regulating device interfaces the computer system through a socket connector. When it is desired to alter the power and voltage levels delivered to components on the circuit board, the original power regulating device is removed from the socket connector and replaced with a second power regulating device which provides different power and voltage levels.

The present invention provides multiple voltage and power levels to IC components that run on multiple voltage and power levels. The present invention also provides systems utilizing a plurality of ICs running on various voltage and power levels with their required voltages.

In accordance with the present invention, the regulator can be positioned close to the components it is regulating without occupying valuable real estate on the circuit board. Hence, the invention achieves stringent circuit tolerances by minimizing the losses associated between the regulator and the component which it is servicing. The design of the present invention also minimizes the effects of heat dissipation of the regulator circuitry.

BRIEF DESCRIPTION OF THE DRAWINGS

The present invention will be understood more fully from the detailed description given below and the accompanied drawings of the preferred embodiment of the invention. The description and drawings are not meant to limit the invention to the specific embodiment. They are provided for explanation and understanding of the present invention.

FIG. 4 illustrates one possible definition of a voltage regulator module receptacle in accordance with the present invention.

DETAILED DESCRIPTION

An apparatus for providing regulated power and voltage to a computer system is disclosed. In the following description, numerous specific details including various control signals, voltage and current values, and types of regulators are set forth to provide a thorough understanding of the preferred embodiment of the present invention. It will be obvious, however, to one skilled in the art that the present invention may be practiced without these specific details. In other instances, well-known circuitry, structures, and methods have not been shown in detail in order to avoid unnecessarily obscuring the present invention.

Figure 1:
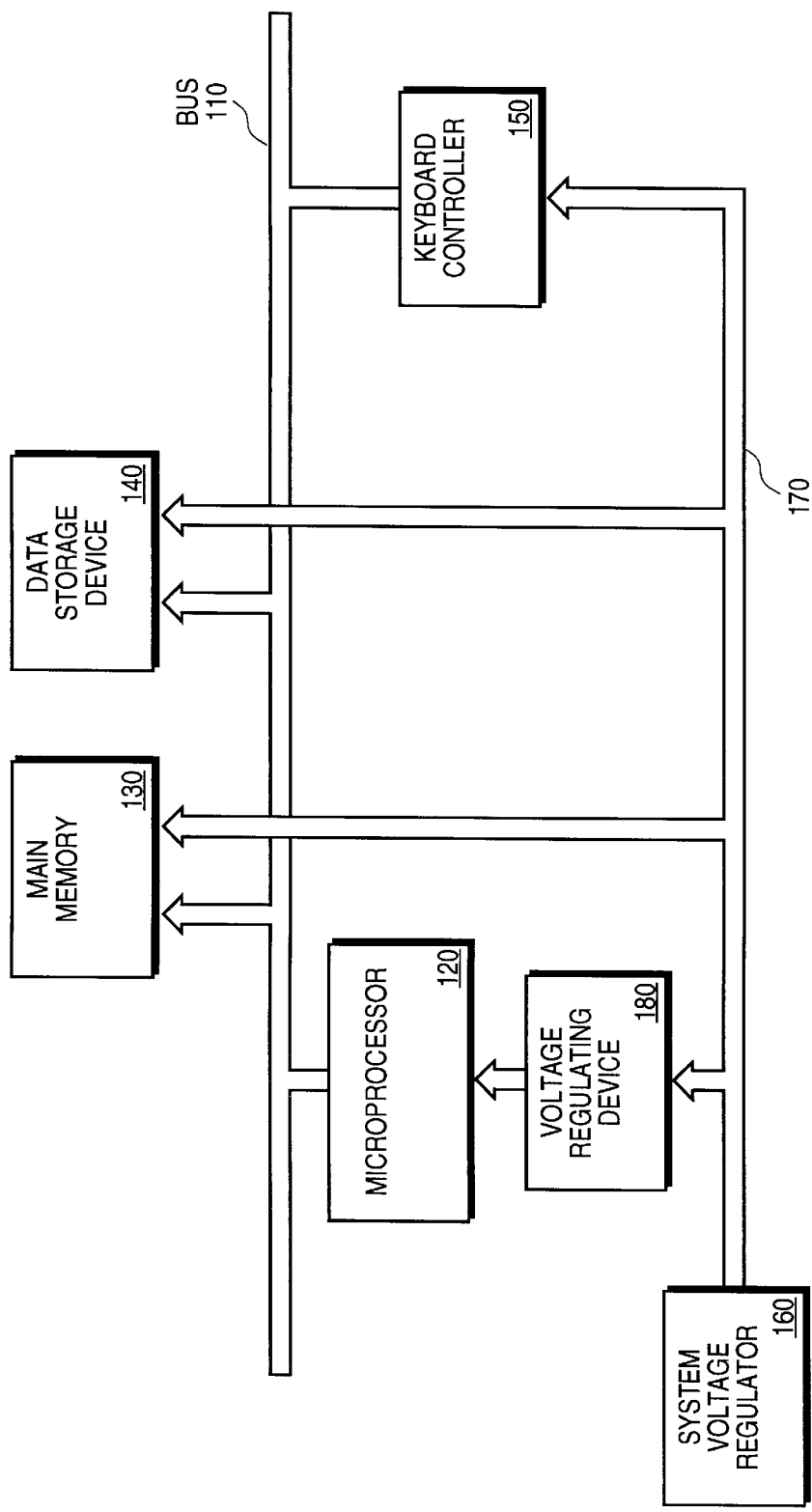
FIG. 1 illustrates a computer system configured with the voltage regulating device of the present invention.

FIG. 1 illustrates a computer system configured with the voltage regulating device of the present invention. The computer system comprises a bus 110 for transferring information. A microprocessor 120 is used for processing information and is coupled to bus 110. Main memory 130 is comprised of random access memory (RAM) or some other dynamic storage device which is used to store the information and instructions executed by the microprocessor 120. Main memory 130 may also be used for storing temporary variables or other intermediate information during execution of instructions by the microprocessor 120.

The computer system also comprises a data storage device 140 such as a hard, floppy, or optical disk drive. The data storage device is also coupled to bus 110 for storing information and instructions. An alphanumeric input device 150, including alphanumeric and other keys, may also be coupled to bus 110 for communicating information to processor 120. System voltage regulator 160 supplies power to voltage regulator module 180, main memory 130, data storage device 140, and keyboard controller 150 by sending a regulated voltage across power bus 170. Voltage regulating device 180 receives the power supplied from voltage regulator 160 and further regulates it to the specifications required by microprocessor 120.

Figure 2:
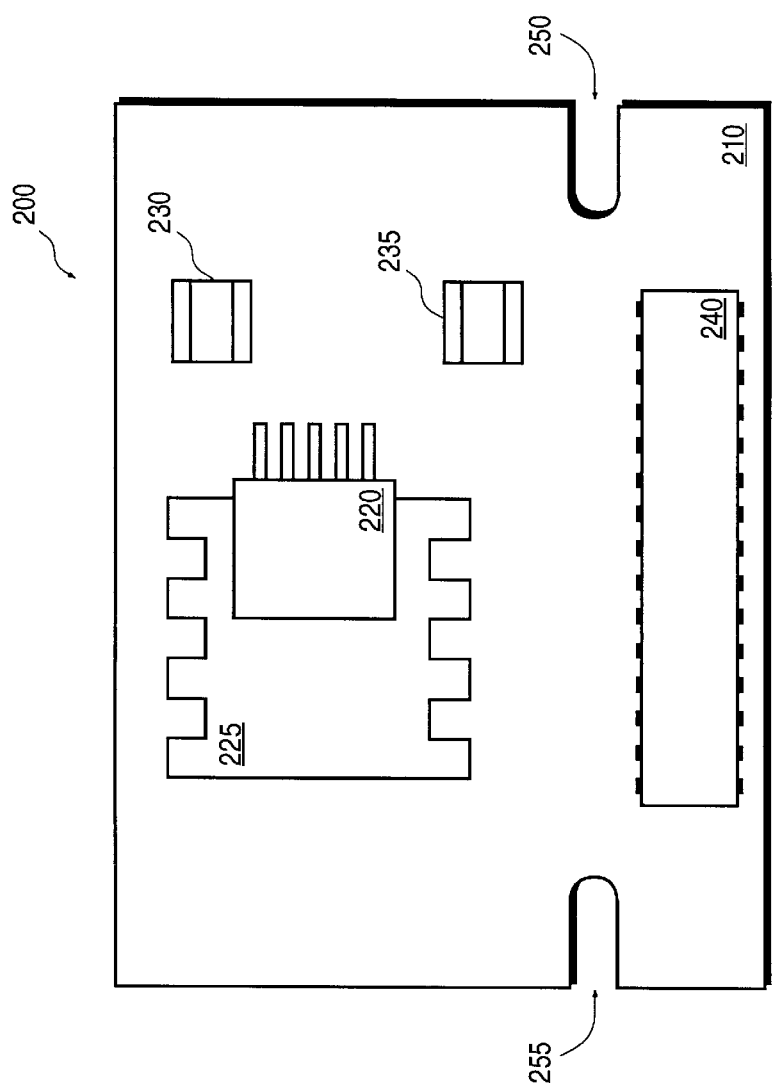
FIG. 2 illustrates one embodiment of the voltage regulator module of the present invention.

FIG. 2 illustrates one embodiment of the voltage regulator module. The electrical components of the voltage regulator module 200 are coupled to a circuit board 210. A voltage regulator 220 is at the center of the circuit board 210. The voltage regulator regulates preset voltage and power levels of the system to specified levels to be used by electrical components on the motherboard. The voltage regulator may be one of many types. In the preferred embodiments of the present invention either a linear regulator or a switching regulator is used. A typical linear regulator regulates by controlling the voltage drop across a power transistor connected in series with a load and is implemented when a fast transient response is most desired. A typical switching regulator regulates by using a power transistor as a switch to provide a pulsed flow of current to a network of inductive and capacitive energy storage elements and is employed when energy efficiency is most desired. Capacitor components 230 and 235 are coupled to the output of the voltage regulator to maintain the regulated voltage level. Voltage regulator 220 could, for example, take the system voltage of 5.0 V and regulate it down to 3.53 V to be used by a microprocessor on the motherboard.

Heat sink element 225 is coupled to the circuit board 210 adjacent to the voltage regulator 220. The heat sink element 225 operates to keep the voltage regulator below its maximum specified operating temperature while not adversely affecting the IC. In choosing a heat sink design, one accounts for the maximum power the voltage regulator 220 will dissipate, the effects of heat conductivity in the voltage regulator 220 and the IC components positioned around the voltage regulator, and the maximum ambient temperature and minimum airflow in which the regulator and those components are expected to operate.

Board mounted receptacle assembly 240 is coupled to the bottom edge of the voltage regulator module. Receptacle assembly 240 allows the voltage regulator module to receive voltages and signals from the computer system and allows the voltage regulator module to send voltages and signals to the computer system. Input and output pins on a header component on the motherboard interfaces directly with the receptacles on the receptacle assembly 240 on the voltage regulator module. In the present embodiment the receptacle assembly 240 is a 30-pin receptacle with 30 individual receptacles for interfacing with 30 pins on the header component.

Slots 250 and 255 (frequently referred to as "dog bite slots") allow for insertion of two latches on the header component on the motherboard. This fastens the voltage module component 200 into the header component on the motherboard and prevents electrical connections between the input and output pins and the receptacle assembly 240 from being broken. In order to remove the voltage 200 regulator module from the header component, one manually pulls the latches in the header component.

Figure 3:
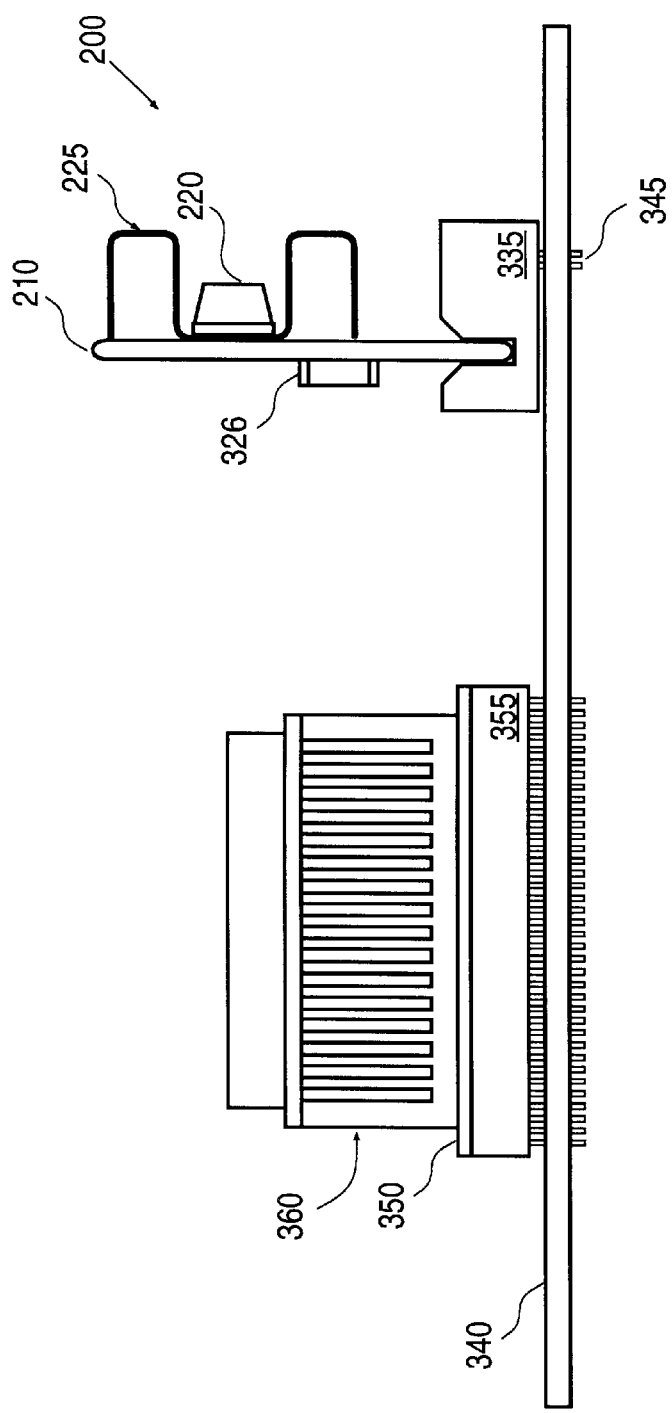
FIG. 3 illustrates a planar view of the voltage regulator module of FIG. 2, as installed on a motherboard.

FIG. 3 illustrates a planar view of the voltage regulator module 200, as installed on a motherboard 340. Microprocessor 350 interfaces with the motherboard 340 through socket component 355. Microprocessor 350 utilizes a fan and heat sink component 360 to keep the microprocessor operating within a specified operating temperature range. Microprocessor 350 operates at a voltage and power level different than that of the system level and requires special regulation.

Voltage regulator module 200 provides the voltage regulation required by processor 350. Header component 335 is a standardized socket connector which allows the voltage regulator module 200 to interface with the motherboard 340. Header component 335 is coupled to the motherboard 340 through pins 345. Header component 335 has a fixed pin definition which allows for a variety of voltage regulator modules to interface with the motherboard 340. Several of the pins on the header component 335 are connected to traces in the motherboard which connect to a system power supply. Other pins on the connector 335 are connected to the power pins of ICs, such as processor 350, for the purpose of powering these devices. If the computer system were to upgrade microprocessor 350 with a second microprocessor operating at different voltage and power levels, voltage regulator module 200 could be replaced with a second voltage regulator module which regulates voltage and power at the level required by the new microprocessor. The detachable voltage regulator module is easy to remove and replace. Thus, regulation to a new microprocessor is achieved without modifying the motherboard design.

The implementation of a voltage regulator module allows the flexibility of replacing the present regulator module with regulator 220, which regulates the voltage and power at one level, with a second voltage regulator module, which regulates voltage and power at a second level. This is an improvement over prior art designs. The present invention provides a means for precisely regulating and controlling voltage to meet the specific voltage and current requirements for the current processor without burdening the circuit board designer with the constraint of having to account for the voltage and current requirements of future processors through the use of on-circuit board regulators or flexible motherboard type designs. Providing the maximal solution for all circuit boards is not necessary. Instead, designers can use a generic circuit board for all processor designs and implement the expensive maximal solution circuitry only when necessary by using a customized voltage regulator module. For all other processor designs, designers can implement a voltage regulator module which provides a less expensive solution.

The geometry and thermal design of the voltage regulator module also provides a solution for minimizing losses and heat dissipation between the voltage regulator unit and the components surrounding its service area. The geometry of the voltage regulator module 200 allows it to be placed close to the microprocessor 350 so that the voltage regulator module 200 can achieve the tight voltage tolerances required by the CPU by minimizing the losses associated between the interconnect of the two components. At the same time the voltage regulator module 200 utilizes space on the vertical plane to minimize the amount of valuable surface space it occupies around the processor. This allows other important components, which need to receive high speed signals, to be placed in close proximity to the processor. Maximal space efficiency is thus achieved. It should be noted that in some motherboard designs vertical space is more valuable than horizontal board surface space. In these situations, the voltage regulator module can be mounted horizontally to maximize space efficiency.

The thermal design of the present invention minimizes the effect of heat dissipation from the voltage regulator 220 on the microprocessor 350 and from the microprocessor 350 on the voltage regulator 220. The components on the voltage regulator module 200 that produce and conduct heat, such as voltage regulator 220 and heat sink element 225, are positioned on the side of the circuit board 210 opposite the processor unit 350. Capacitors 326 which do not pose heat dissipation problems are positioned on the side of the circuit board 210 facing the processor unit 350. This allows the heat from these components to be dissipated on the side away from the processor and to be separated by the voltage regulator module circuit board 210. The voltage regulator module 200 is parallel to the airflow of the processor 350 so that heated air neither flows in the direction of the voltage regulator module 200 to the processor 350 nor in the direction of the processor 200 to the voltage regulator module. The design of the present invention is an improvement over the prior art design of an on-chip regulator where the positioning of the regulators and the processor components caused heat dissipation problems. The design of this invention allows the voltage regulator 220 to be placed close to the microprocessor 350 such that the tight voltage tolerance voltage of the microprocessor is achieved 350 without sacrificing thermal isolation.

FIG. 4 illustrates one possible definition of the receptacle assembly's receptacle definition in accordance with the present invention. The receptacles are divided into two columns and fifteen rows. The receptacles on rows 1 and 2 of column A and B, row 9 of column A, and row 13 of columns A and B are designated $V_{SS}$. These receptacles interface with pins on the header component which are connected to ground. The receptacles on row 5 of column A and B, and row 6 of column A and B are for system voltage inputs. The computer system sends 3.3 volts to the voltage regulator module at these designated receptacles. Likewise, the receptacles on row 14 of column A and B and row 15 of column A and B are also for system voltage inputs. The computer system sends 5.0 volts to the voltage regulator module at these designated receptacles. The receptacle at row 3 of column A has no forced definition, but can optionally be used as an system voltage input pin to input 12.0 volts. The voltages inputted at these receptacles may be regulated up, regulated down, or passed through the voltage regulator module depending on the need of the computer system.

The receptacles on rows 7–10 designated $V_{core}$ are for voltage output. Voltage from the $V_{core}$ receptacles is sent to circuitry in the microprocessor which performs processing. The receptacles on rows 3 and 4 designated $V_{I/O}$ are also for voltage output. Voltage from the $V_{I/O}$ receptacles is sent to the circuitry in the processor which runs the input/output circuitry.

The receptacles on rows 11 and 12 of columns A and B are designated for four control signals. The PWRGOOD signal is an optional output signal which is driven high upon the voltage regulator module output reaching valid levels. If the output of the voltage regulator module is not within the tolerance of the component to be serviced, the signal is driven low. The SENSE signal is an input signal to the module. The function of this signal is to implement a remote sensing option. This signal will provide the voltage level of the output voltage at a desired remote location, such as the socket pins, to correct for voltage drops across the interconnect. UPVRM# signal is a 3.3 volt output signal from the voltage regulator module. This signal is provided to determine if the module is an upgrade or Over Drive™ processor (ODP) module or an original equipment manufacturer (OEM) module. The low state indicates an upgrade module and a high state indicates an OEM module. The DISABLE signal is a standard TTL level input signal typically from a processor to the voltage regulator module. This signal is provided for controlling the output voltage. The high signal state disables the output voltage of the voltage regulator module to prevent operation with an incorrectly matched processor.

Figure 5:
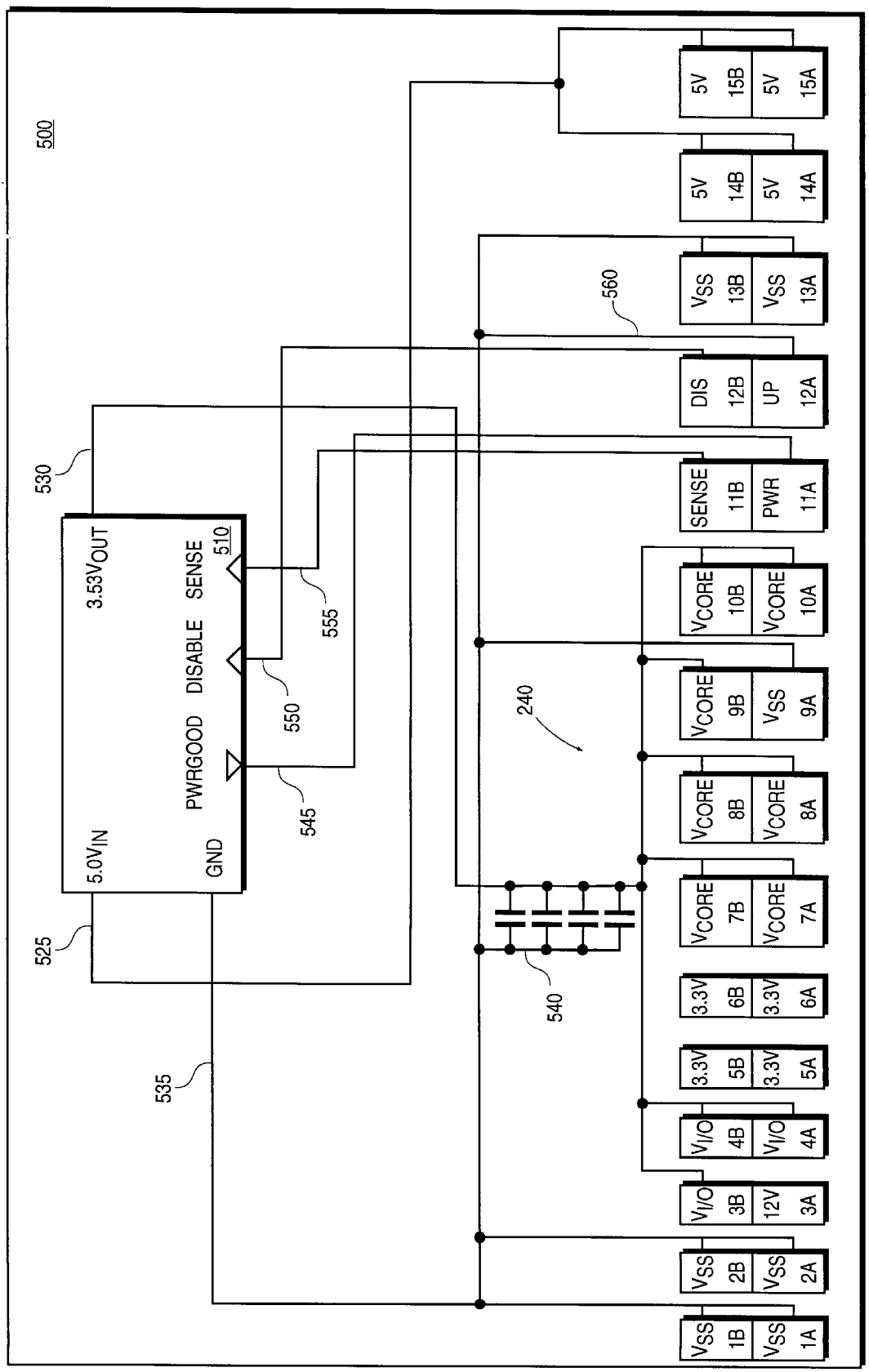
FIG. 5 is a block diagram showing one implementation of the voltage regulator module for a single voltage processor.

FIG. 5 is a block diagram showing one implementation of the voltage regulator module for a single voltage processor operating at 3.53 volts. The voltage regulator module 500 comprises voltage regulation circuitry 510 and receptacle assembly 240. Voltage regulation circuitry 510 regulates an input voltage from the computer system to a desired output voltage to power a component such as a microprocessor.

In the present implementation of the voltage regulator module 500, voltage regulation circuitry 510 receives a 5.0 volt input from line 525 connected to receptacles 14A, 14B, 15A, and 15B. For a microprocessor requiring an input voltage of 3.53 volts, voltage regulation circuitry 510 would be programmed to regulate the 5.0 volt input down to 3.53 volts and send it to line 530 connected to $V_{core}$ and $V_{I/O}$ receptacles 7A, 7B, 8A, 8B, 9B, 10A, 10B, 3B, 4A, and 4B. $V_{core}$ receptacles 7A, 7B, 8A 8B, 9B, 10A, and 10B interface with pins on the header component which connect to the power pins of the microprocessor which power the processing circuitry. $V_{I/O}$ receptacles 3B, 4A, and 4B interface with pins on the header component which connect to the power pins of the microprocessor which power the input/output circuitry. Receptacles 1A, 1B, 2A, 2B, 9A, 13A, and 13B interface with pins on the header component which are connected to ground. These are connected to voltage regulation circuitry through line 535 and provide grounding for the circuitry. Capacitors 540 are connected to the output line 530 and the ground line 535 and serve to maintain the voltage level on output line 530.

Line 545 connects the PWRGOOD socket on receptacle assembly 240 to the PWRGOOD output on voltage regulator circuitry 510. The PWRGOOD signal is an output signal from the voltage regulator module which is driven to a valid low state when the voltage regulator module output is not within valid levels. Line 550 connects the DISABLE socket on receptacle assembly 240 to the DISABLE input on the voltage regulation circuitry 510. The DISABLE signal is a 5 volt input signal to the module for controlling the output of the voltage regulation circuitry 510. A high state disables the output of the voltage regulation circuitry 510. Line 555 connects the SENSE socket on receptacle assembly 240 to the SENSE input on the voltage regulation circuitry 510. The SENSE signal is an input signal to the voltage regulation circuitry 510. The function of the signal is to provide the voltage level of the output voltage at a desired remote location. The SENSE signal allows the voltage regulation circuitry 510 to correct for voltage drops across interconnects. Line 560 connects the UPVRM# socket on receptacle assembly 240 to ground line 535. The UPVRM# signal from the voltage regulator module 500 is provided for determining if the voltage regulator module 500 is an upgrade module or an OEM module. A low state indicates that the voltage regulator module is an upgrade module and a high state indicates that it is a OEM module. In the present case, a low state is indicated.

Figure 6:
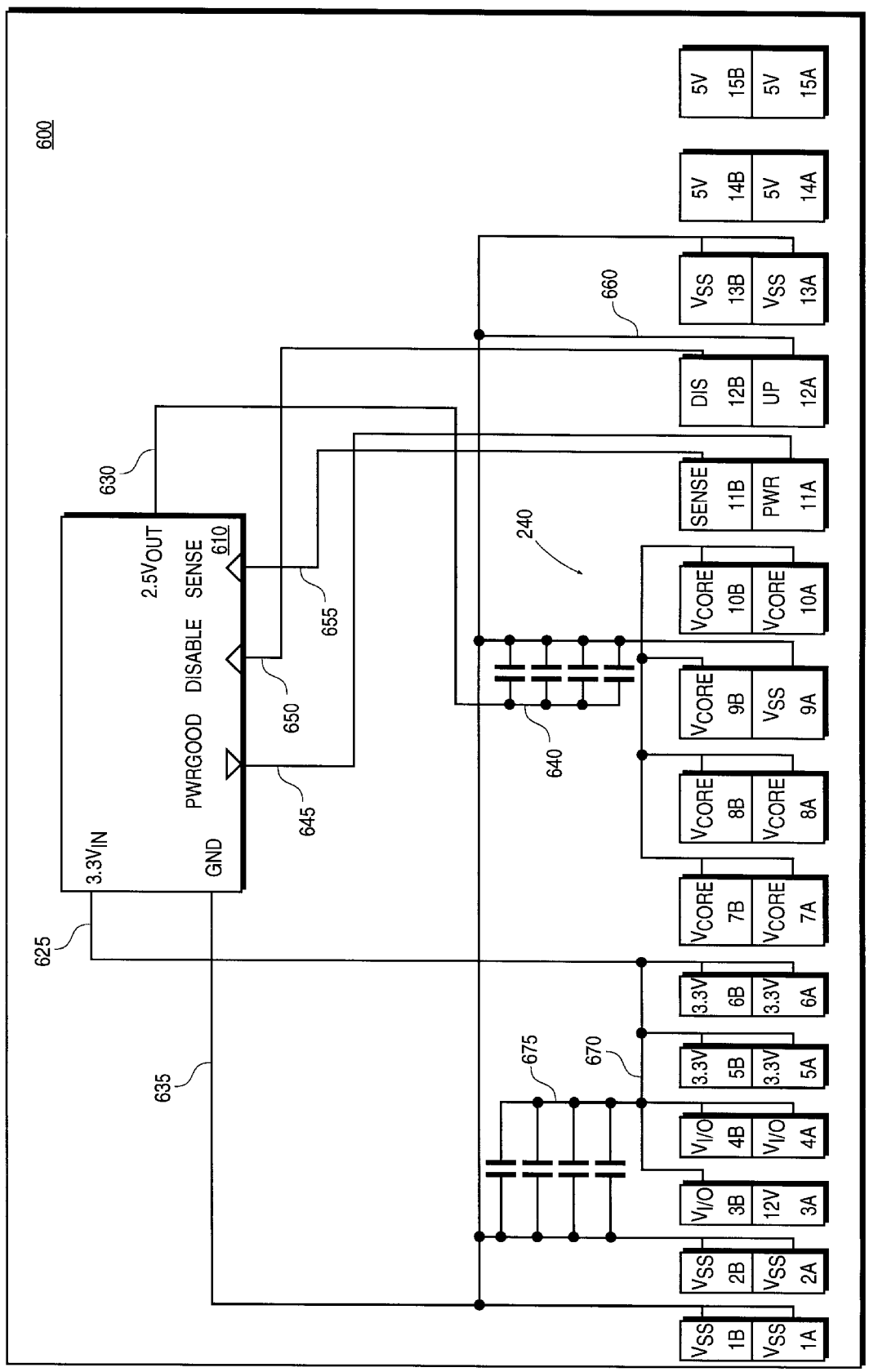
FIG. 6 is a block diagram showing another implementation of the voltage regulator module for a dual voltage processor.

FIG. 6 is a block diagram showing another implementation of the voltage regulator module for a dual voltage processor operating at 2.5 and 3.3 volts. The voltage regulator module 600 comprises voltage regulation circuitry 610 and receptacle assembly 240. Voltage regulation circuitry 610 regulates an input voltage from the computer system to a desired output voltage to power a component such as a microprocessor.

In the present implementation of the voltage regulator module 600, voltage regulation circuitry 610 receives a 3.3 volt input from line 625 connected to receptacles 5A, 5B, 6A, and 6B. Voltage regulation circuitry 610 regulates the 3.3 volt input down to 2.5 volts and sends it to line 630 connected to $V_{core}$ receptacles 7A, 7B, 8A, 8B, 9B, 10A, 10B. $V_{core}$ receptacles 7A, 7B, 8A 8B, 9B, 10A, and 10B interface with pins on the header component which connect to the power pins of the microprocessor which power the processing circuitry. Line 670 connect receptacles 5A and 5B carrying input voltage 3.3 volts to $V_{I/O}$ receptacles 3A, 3B, 4A, 4B. $V_{I/O}$ receptacles 3B, 4A, and 4B which interface with pins on the header component connected to the power pins of the microprocessor which power the input/output circuitry. Receptacles 1A, 1B, 2A, 2B, 9A, 13A, and 13B interface with pins on the header component which are connected to ground. These pins are connected to voltage regulation circuitry through line 635 and provide grounding for the circuitry. Capacitors 640 are connected to the output line 630 and the ground line 635 and serve to maintain the voltage level on output line 630. Capacitors 675 are connected to line 670 and the ground line 635 and serve to maintain the voltage level on line 670.

Line 645 connects the PWRGOOD socket on receptacle assembly 240 to the PWRGOOD output on voltage regulator circuitry 610. Line 650 connects the DISABLE socket on receptacle assembly 240 to the DISABLE input on the voltage regulation circuitry 610. Line 655 connects the SENSE socket on receptacle assembly 240 to the SENSE input on the voltage regulation circuitry 610. Line 660 connects the UPVRM# socket on receptacle assembly 240 to ground line 635. This gives a low output signal indicating that the voltage regulator module is a upgrade module. A high signal would indicate an OEM voltage regulator module.

Figure 7:
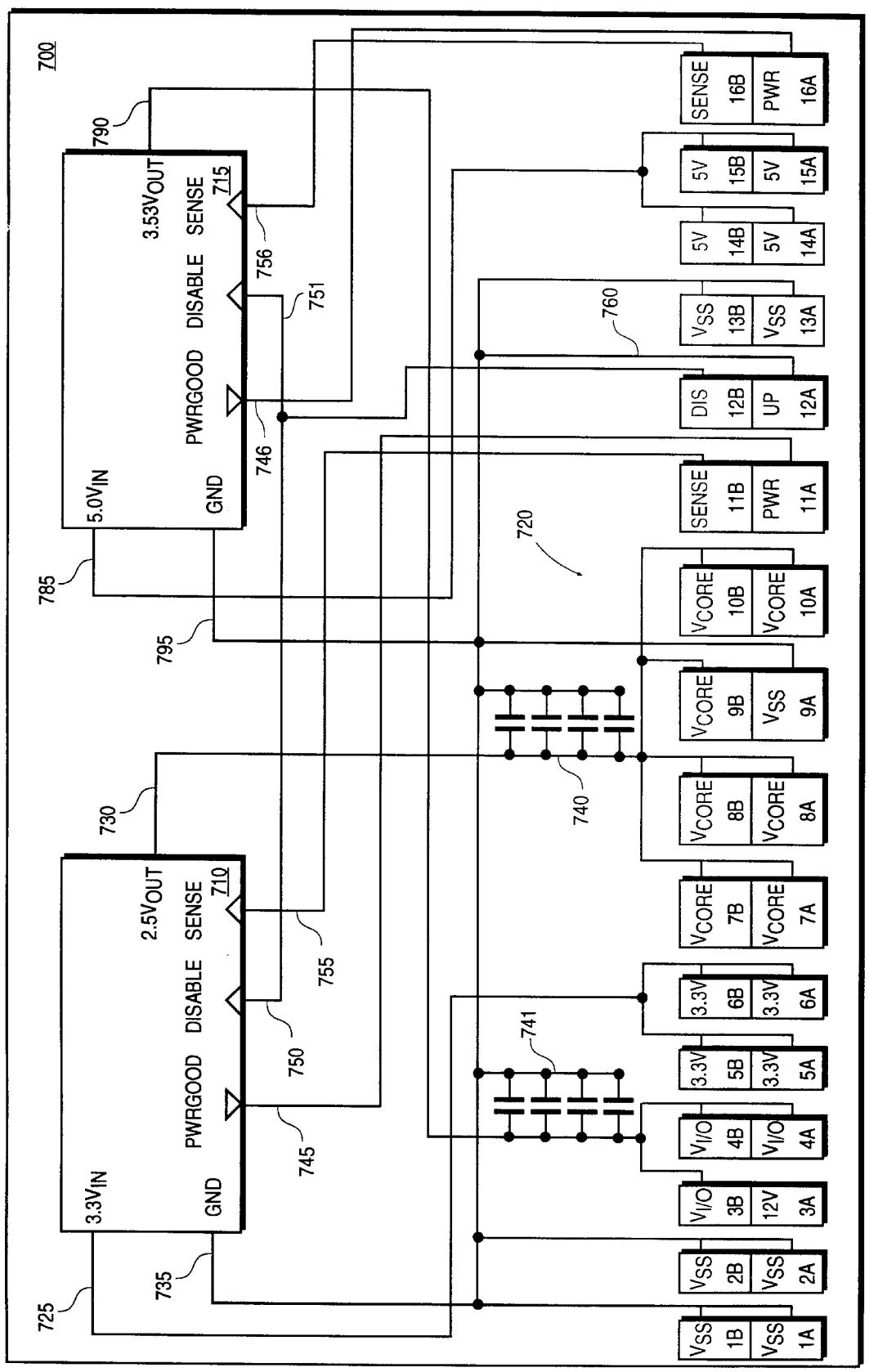
FIG. 7 illustrates a block diagram for an implementation of the voltage regulator module for a dual voltage processor where two regulators are utilized.

The present invention is capable of implementing a plurality of voltage regulators on a single voltage regulator module. FIG. 7 illustrates a block diagram for an implementation of the voltage regulator module for a dual voltage processor operating at 2.5 and 3.53 volts where two voltage regulators are utilized. The voltage regulator module 700 comprises voltage regulation circuitry 710 and 715 and receptacle assembly 720. Voltage regulation circuitry 710 and 715 regulate input voltages from the computer system to desired output voltages for powering a component such as a microprocessor.

In the present implementation of the voltage regulator module 700, voltage regulation circuitry 710 receives a 3.3 volt input from line 725 connected to receptacles 5A, 5B, 6A, and 6B. Voltage regulation circuitry 710 regulates the 3.3 volt input down to 2.5 volts and sends it to line 730 connected to $V_{core}$ receptacles 7A, 7B, 8A, 8B, 9B, 10A, and 10B. $V_{core}$ receptacles 7A, 7B, 8A 8B, 9B, 10A, and 10B interface with pins on the header component which connect to the power pins of the microprocessor which power the processing circuitry. Voltage regulation circuitry 715 receives a 5.0 volt input from line 785 connected to receptacles 14A, 14B, 15A, and 15B. Voltage regulation circuitry 715 regulates the 5.0 volt input down to 3.53 volts and sends it to line 790 connected to $V_{I/O}$ receptacles 3B, 4A, and 4B. $V_{I/O}$ receptacles 3B, 4A, and 4B interface with pins on the header component which connect to the power pins of the microprocessor which power the input/output circuitry. Receptacles 1A, 1B, 2A, 2B, 9A, 13A, and 13B interface with pins on the header component which are connected to ground. These pins are connected to voltage regulation circuitry 710 and 715 through lines 735 and 795 and provide grounding for the circuitry. Capacitors 740 are connected to the output line 730 and ground and serve to maintain the voltage level on output line 790. Capacitors 741 are connected to output line 790 and ground and serve to maintain the voltage level on output line 790.

Line 745 connects the PWRGOOD socket 11A on receptacle assembly 720 to the PWRGOOD output on voltage regulator circuitry 710. Line 750 connects the DISABLE socket 12B on receptacle assembly 720 to the DISABLE input on the voltage regulation circuitry 710. Line 755 connects the SENSE socket 11B on receptacle assembly 720 to the SENSE input on the voltage regulation circuitry 710. Line 746 connects the PWRGOOD socket 16A on receptacle assembly 720 to the PWRGOOD output on voltage regulator circuitry 710. Line 751 connects the DISABLE socket 12B on receptacle assembly 720 to the DISABLE input on the voltage regulation circuitry 710. Line 756 connects the SENSE socket 16B on receptacle assembly 720 to the SENSE input on the voltage regulation circuitry 710. Line 760 connects the UPVRM# socket on receptacle assembly 720 to ground. This gives a low output signal indicating that the voltage regulator module is a upgrade module. A high signal would indicate an OEM voltage regulator module.

As illustrated in FIGS. 5, 6, and 7, the present invention can be used to regulated voltage and power to a single voltage processor or a dual voltage processor. The number of receptacles and the number of voltages on the present invention can be increased to provide any number of voltages to any number of processors within normal system design frames. Thus, the present invention is capable of regulating voltage and power to a plurality of single or multiple voltage processors within the given current carrying and delivering capability of the module.

In another embodiment of the present invention, when the voltage requirement of a processor matches one of the available system voltages and tolerances, a voltage regulator module with connections from the system voltage receptacles to either the $V_{core}$ or $V_{I/O}$ receptacles on the receptacle assembly can be implemented. The connections would serve as routers for routing the system voltages to the computer system without further regulation. The voltage regulator module would act as a "shorting block" in this implementation.

The present invention could be implemented in a motherboard design having a pre-existing voltage regulator or power supply. The present invention could be configured to disable or disconnect the pre-existing voltage regulator or power supply when a voltage regulator module is inserted into the header component. This can be achieved by utilizing the various control signals available at the voltage regulator module.

The present invention may be programmed a number of ways. In the embodiment of the voltage regulator module described, one programs the invention by unplugging the current voltage regulator module from the header component on the motherboard and plugging in a second voltage regulator module which is designed to regulate voltage and power at the new desired levels. Other embodiments of the present invention include implementing jumpers and decoders in the voltage regulating module. An embodiment implementing jumpers allows the user to reconfigure the voltage regulation circuitry manually to regulate the output voltage at different levels. An embodiment of the present invention implementing a decoder circuit with the voltage regulation circuitry allows a processor to communicate with the voltage regulation circuitry and to set the voltage level which the voltage regulation circuit is to regulate. Both the jumper and decoder implementations allow the user additional flexibility in resetting the voltage levels within each voltage regulator module.

Figure 8:
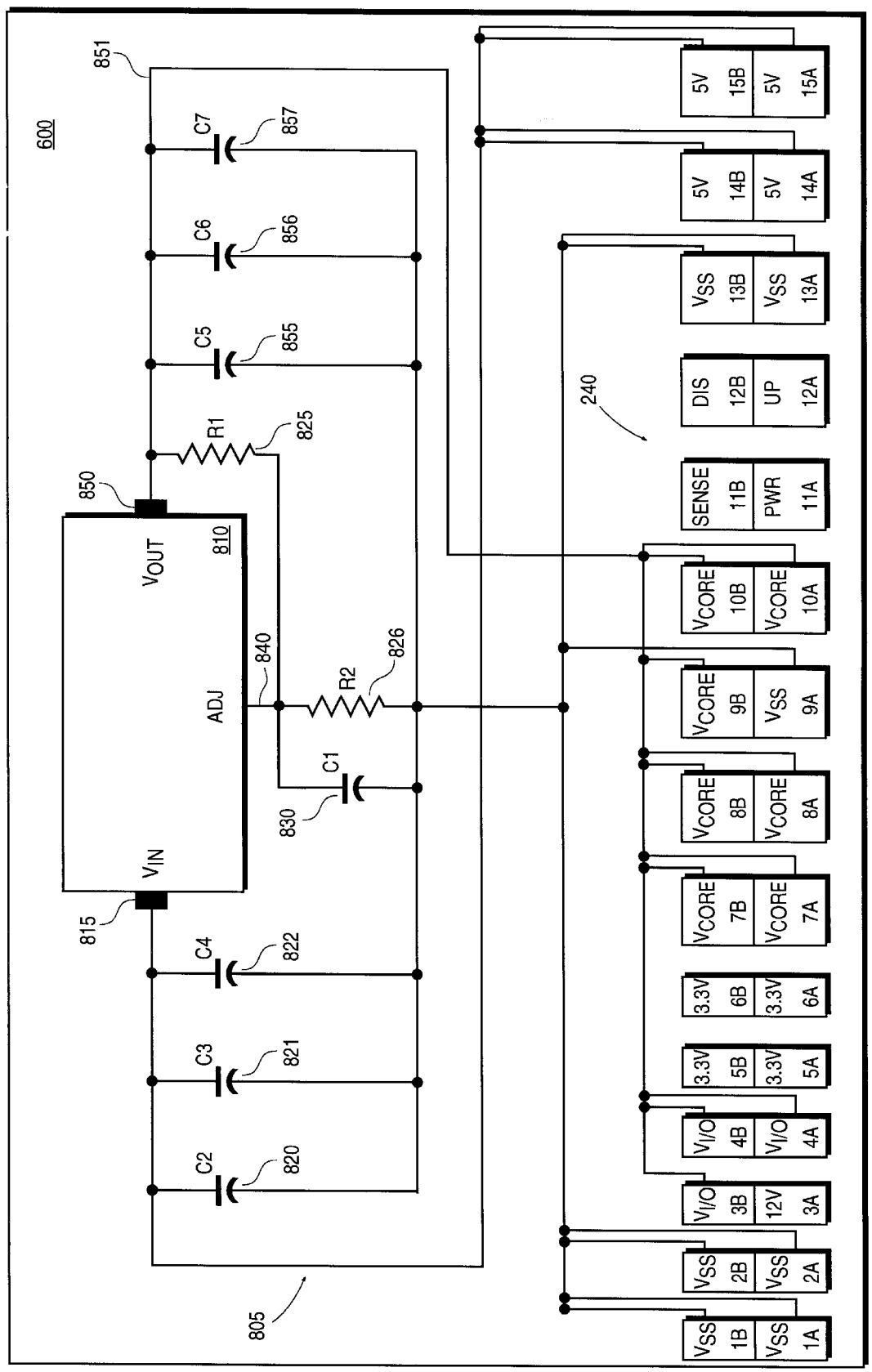
FIG. 8 is a schematic of one implementation of the voltage regulator module using a linear regulator.

FIG. 8 shows a schematic of one embodiment of the voltage regulator module using a linear regulator. It should be understood that this schematic is shown for purposes of illustrating the invention and that other circuit designs may be utilized within the scope of this invention. The voltage regulator module comprises voltage regulating circuitry 805 and a receptacle assembly 240. A linear regulator chip 810 is used by the voltage regulating circuitry 805 to regulate voltage. Regulator chip 810 comprises an input terminal 815 for receiving input voltages, a linear regulator for regulating the input voltage, an adjustment pin 840 for programming the level which the output voltage is to be regulated, and an output terminal 850 for sending out the regulated output voltage. The linear regulator chip receives 5 volts from the system voltage supply at input terminal 815. Input terminal 815 is connected to receptacles 14A, 14B, 15A, and 15B on receptacle assembly 240. Capacitors 820–822 are used for input capacitance and decouple fast transients from the 5 volt supply from the system. Resistors 825 and 826 form a feedback divider used for setting the desired output voltage of the linear regulator chip 810 through adjustment pin 840. The feedback divider can be set, for example, to program the linear regulator chip 810 to produce a 3.53 volt output at output terminal 850. Capacitor 830 serves to bypass the feedback divider at high frequencies to speed up the linear regulator's response. Capacitors 855–857 are used for output capacitance for maintaining the level of the output voltage to the system.

The regulated output voltage from the linear regulator chip 810 is sent to $V_{I/O}$ and $V_{core}$ receptacles 7A, 7B, 8A, 8B, 9B, 10A, 10B, 3B, 4A, and 4B. PWRGOOD receptacle 11A is connected to the regulated output voltage on line 851 and UPVRM# receptacle 12A is connected to receptacles 1A, 1B, 2A, 2B, 9A, 13A, and 13B which interface with pins on the header component which are connected to ground. In this embodiment of the voltage regulator module, receptacles 5A, 5B, 6A, and 6B designated for a 3.3 volt input are not used. Receptacle 11 B designated for sensing functions and receptacle 12B designated for disabling functions are also not used.

What is claimed is:

1. An apparatus for regulating voltage in an electronic device, comprising:
   a detachable voltage regulator module having a receptacle assembly that includes a plurality of receptacles mounted on the detachable voltage regulator module; and
   a socket connector, coupled to the electronic device, having an opening that receives the receptacle assembly and a plurality of pins that allow the socket connector to interface with the receptacle assembly.

2. The apparatus of claim 1, wherein the detachable voltage regulator module comprises a router that routes a voltage from the electronic device to a component on the electronic device.

3. The apparatus of claim 1, wherein the detachable voltage regulator module comprises jumpers that program the detachable voltage regulator module to regulate a first voltage level to a second voltage level.

4. The apparatus of claim 1, wherein the detachable voltage regulator module comprises a plurality of voltage regulators that regulate a plurality of voltages to the electronic device.

5. The apparatus of claim 1, wherein the detachable voltage regulator module and socket connector may be mounted in either a horizontal or vertical plane.

6. The apparatus of claim 1, wherein the electronic device is a computer system.

7. The apparatus of claim 6, wherein the detachable voltage regulator module comprises a circuit that instructs the voltage regulator module to regulate a first voltage level to a second voltage level.

8. The apparatus of claim 7, wherein the circuit is programmable by a microprocessor in the computer system.

9. The apparatus of claim 6, where in the apparatus is positioned in a plane parallel to air flow of a microprocessor in the computer system.

10. A computer system comprising:

a bus;

a microprocessor coupled to the bus;

a memory coupled to the bus; and a voltage regulating device, coupled to the microprocessor, comprising a detachable voltage regulator module having a receptacle assembly that includes a plurality of receptacles mounted on the detachable voltage regulator module, and a socket connector having an opening that receives the receptacle assembly and a plurality of pins that allow the socket connector to interface with the receptacle assembly.

11. The apparatus of claim 10, wherein the detachable voltage regulator module comprises a router that routes a voltage from a system power supply to a component on the computer system.

12. The apparatus of claim 10, wherein the detachable voltage regulator module comprises jumpers that program the detachable voltage regulator module to regulate a first voltage level to a second level.

13. The apparatus of claim 10, wherein the detachable voltage regulator module comprises a plurality of voltage regulators that regulate a plurality of voltages to the computer system.

14. The apparatus of claim 10, wherein the detachable voltage regulator module comprises a circuit that instructs the voltage regulator module to regulate a first voltage level to a second voltage level.

15. The apparatus of claim 10, wherein the circuit is programmable by the microprocessor.

16. The apparatus of claim 10, wherein the detachable voltage regulator module and socket connector may be mounted in either a horizontal or vertical plane.

17. The apparatus of claim 10, where in the apparatus is positioned in a plane paralleled to air flow of the microprocessor.

18. An apparatus for regulating voltage in an electronic device, comprising:

a detachable voltage regulator module having a receptacle assembly mounted on the detachable voltage regulator module; and a socket connector, residing on a same board and coupled to the electronic device, having an opening that receives the receptacle assembly and interfaces the detachable voltage regulator module with the electronic device.

19. The apparatus of claim 18, wherein the receptacle assembly comprises a plurality of receptacles that receives a plurality of pins from the socket connector.

20. The apparatus of claim 18, wherein the socket connector comprises a plurality of pins that allow the socket connector to interface with the receptacle assembly.

21. A computer system comprising:

a bus;

a microprocessor coupled to the bus;

a memory coupled to the bus; and a voltage regulating device, residing on a same board and coupled to the microprocessor, comprising a detachable voltage regulator module having a receptacle assembly mounted on the detachable voltage regulator module, and a socket connector having an opening that receives the receptacle assembly and interfaces the detachable voltage regulator module with the microprocessor.

22. The computer system of claim 21, wherein the receptacle assembly comprises a plurality of receptacles that receives a plurality of pins from the socket connector.

23. The computer system of claim 21, wherein the socket connector comprises a plurality of pins that allow the socket connector to interface with the receptacle assembly.

* * * * *

UNITED STATES PATENT AND TRADEMARK OFFICE
CERTIFICATE OF CORRECTION

PATENT NO. : 6,594,556 B1
DATED : July 15, 2003
INVENTOR(S) : Agatstein et al.

It is certified that error appears in the above-identified patent and that said Letters Patent is hereby corrected as shown below:

Column 9,
Line 20, delete "regulated" and insert -- regulate --.

Signed and Sealed this

Seventeenth Day of August, 2004

JON W. DUDAS
*Acting Director of the United States Patent and Trademark Office*